(12) United States Patent
Suzuki et al.

(10) Patent No.: US 8,704,244 B2
(45) Date of Patent: Apr. 22, 2014

(54) LED LIGHT EMITTING DEVICE

(75) Inventors: Hirokazu Suzuki, Kyoto (JP); Jun Konishi, Maibara (JP); Yuichiro Tanaka, Kyoto (JP); Kenji Yoneda, Kyoto (JP)

(73) Assignee: CCS, Inc., Kyoto (JP)

( * ) Notice: Subject to any disclaimer, the term of this patent is extended or adjusted under 35 U.S.C. 154(b) by 0 days.

(21) Appl. No.: 13/146,889

(22) PCT Filed: Feb. 5, 2010

(86) PCT No.: PCT/JP2010/051721
§ 371 (c)(1),
(2), (4) Date: Jul. 28, 2011

(87) PCT Pub. No.: WO2010/090289
PCT Pub. Date: Dec. 8, 2010

(65) Prior Publication Data
US 2011/0278606 A1    Nov. 17, 2011

(30) Foreign Application Priority Data
Feb. 5, 2009 (JP) .................. 2009-024884

(51) Int. Cl.
*H01L 29/18* (2006.01)

(52) U.S. Cl.
USPC .... 257/88; 257/89; 257/E33.01; 257/E33.03; 257/E33.061; 257/79; 313/467; 313/468; 313/485; 313/500; 313/502

(58) Field of Classification Search
USPC ............... 257/88, 89, 103, E33.01, E33.03, 257/E33.061; 313/467, 468, 485, 487, 501, 313/500, 502, 486
See application file for complete search history.

(56) References Cited

U.S. PATENT DOCUMENTS 3,146,369 A * 8/1964 Kaplan .................. 313/403
3,344,301 A * 9/1967 Kaplan .................. 313/472
(Continued)

FOREIGN PATENT DOCUMENTS

| CN | 1825647 | 8/2006 |
| CN | 101268554 | 9/2008 |

(Continued)

OTHER PUBLICATIONS

Chinese Application No. 201080006776.4 Office Action dated Nov. 30, 2012, 6 pages.

(Continued)

*Primary Examiner* — Cuong Q Nguyen
*Assistant Examiner* — Galina Yushina

(57) ABSTRACT

In order to provide an LED light emitting device that can easily control a color temperature of white light, the LED light emitting device is provided with a plurality of types of light emitting parts that: respectively have LED elements that emit ultraviolet radiation or violet color visible light, and phosphors that absorb the ultraviolet radiation or violet color visible light to emit colored light; and emit the colored light, wherein: the colored light emitted by the plurality of types of light emitting parts become white light when all mixed with each other; the LED elements of the plurality of types of light emitting parts are all the same ones, and mounted on a single base material; and two or more light emitting parts overlap with each other in their parts.

18 Claims, 13 Drawing Sheets

(56) References Cited

U.S. PATENT DOCUMENTS

| | | | |
|---|---|---|---|
| 3,855,499 A * | 12/1974 | Yamada et al. | 345/75.2 |
| 3,875,456 A * | 4/1975 | Kano et al. | 313/501 |
| 7,097,887 B2 * | 8/2006 | Kelly et al. | 428/1.1 |
| 7,775,687 B2 * | 8/2010 | Nishi et al. | 362/329 |
| 2004/0256626 A1 | 12/2004 | Wang et al. | |
| 2005/0057145 A1 | 3/2005 | Shieh et al. | |
| 2006/0226759 A1 * | 10/2006 | Masuda et al. | 313/486 |
| 2006/0244359 A1 * | 11/2006 | Kang | 313/493 |
| 2007/0145884 A1 * | 6/2007 | Wu et al. | 313/503 |
| 2007/0222361 A1 | 9/2007 | Nishi et al. | |
| 2010/0025700 A1 | 2/2010 | Jung et al. | |
| 2010/0102704 A1 * | 4/2010 | Jermann et al. | 313/487 |

FOREIGN PATENT DOCUMENTS

| | | |
|---|---|---|
| EP | 1433831 | 6/2004 |
| JP | 06-151974 | 5/1994 |
| JP | 09-015589 | 1/1997 |
| JP | 2004-134524 | 4/2004 |
| JP | 2005-244226 | 9/2005 |
| JP | 2006-237217 | 9/2006 |
| JP | 2006-303373 | 11/2006 |
| JP | 2007-126536 | 5/2007 |
| JP | 2008-060129 | 3/2008 |
| JP | 2008-160061 | 7/2008 |
| RU | 2233013 | 7/2004 |

OTHER PUBLICATIONS

Chinese Application No. 201080006776.4 Office Action dated Apr. 28, 2013, 6 pages.

* cited by examiner

LED LIGHT EMITTING DEVICE

TECHNICAL FIELD

The present invention relates to an LED light emitting device that can easily control a color temperature of white light.

BACKGROUND ART

Conventionally, there is known an LED light emitting device that uses three types of LED elements, i.e., red, green, and blue LED elements, to emit white light (Patent literature 1). However, the respective LED elements have different forward voltage drops (vf), i.e., the red LED element has a forward voltage drop of approximately 2.0 V, green LED element approximately 3.3 V, and blue LED element approximately 3.4 V, so that, to adjust amounts of currents applied to the respective LED elements to adjust a balance among light amounts, a complicated calculation process is required, and for this reason, there is a problem that controlling a color temperature of the white light is difficult.

Also, in such a conventional LED light emitting device, red light, green light, and blue light respectively emitted from the LED light emitting device are mixed outside the device to generate the white light, so that even in the case where, from a distance, recognition as the white light can be gained, as viewed from an extremely close distance, the white light is nothing more than being separately recognized as the red light, the green light, and the blue light. For this reason, in order to use such a conventional LED light emitting device as a white light source, a sufficient distance is required from the light source, and therefore the conventional LED light emitting device is inappropriate for a light source for irradiating a close place.

Such a problem is also recognized even in an LED light emitting device that separately uses red, green, and blue phosphors without combining them to form, in the same device, a red color light emitting part, a green color light emitting part, and a blue color light emitting part that are partitioned from one another.

Also, in any of the configurations, in the case of, outside a device, mixing respective single color light of red, green, and blue, which were once emitted outside the device, to generate white light, if a light amount of any of the color light is changed, a color temperature of the white light is also largely changed. For this reason, a lot-based variation or difference in deterioration rate among LED elements largely affects the color temperature of the resultant white light, and therefore it is not easy to control it, for example, an extremely fine adjustment or complicated calculation process is required. This means that in an LED light emitting device employing a configuration in which red light, green light, and blue light, which were once emitted outside the device, are mixed to generate white light, even in the case of attempting to finely adjust a color temperature of the white light, the color temperature is likely to be largely changed, and in such a type of LED light emitting device, controlling a color temperature of white light requires a complicated calculation process after all, and is not easy.

CITATION LIST

Patent Literature

[Patent literature 1] JPA Heisei 6-151974

SUMMARY OF INVENTION

Technical Problem

The present invention is made in consideration of such a problem, and has a main object to provide an LED light emitting device that can easily make a fine adjustment of a color temperature of white light.

Solution to Problem

That is, an LED light emitting device according to the present invention is provided with a plurality of types of light emitting parts each having: an LED element that emits ultraviolet radiation or violet color visible light; and a phosphor that absorbs the ultraviolet radiation or the violet color visible light to emit colored light, wherein: lights emitted by the plurality of types of light emitting parts become white light when all mixed with one another; the LED elements of the plurality of types of light emitting parts are all same ones, and mounted on a single base material; and two or more light emitting parts overlap with each other in their parts.

Note that the ultraviolet radiation refers to electromagnetic radiation having a wavelength of 200 to 400 nm, which includes near-ultraviolet radiation (200 to 380 nm). Also, in the present invention, white light is one type among colored light, and particularly, among the colored light, refers to light that is defined by JIS Z 8725 "Methods for determining distribution temperature and color temperature or correlated color temperature of light sources", and has chromaticity near a black body radiation locus. Note that a chromaticity coordinate of the black body radiation locus is, in the case of being expressed in a uv coordinate (CIE 1960 UCS chromaticity diagram), as in the appendix table 1 of the above standard, and in particular, the white light in the present invention is preferably light having a chromaticity coordinate with a deviation of 0.02 or less in the CIE 1960 UCS chromaticity diagram. This is, in the case of exemplifying the black body radiation locus in an xy coordinate (CIE 1931 chromaticity diagram), light positioned in a range surrounded by, in the appended FIG. 1 of the above standard, curves corresponding to duv=0.02 and duv=−0.02, straight lines corresponding to Tcp^−1=0 and Tcp^−1=640, and spectrum locus.

Further, in the present invention, the number of the light emitting parts and the number of the LED elements may be the same or different, and a plurality of light emitting parts may share one and the same LED element.

If so, the two or more light emitting parts overlap with each other in their parts in the single LED light emitting device, and thereby from the overlapping portion, light having intermediate color other than the respective single color light of red light, green light, and blue light is emitted, so that even as viewed from an extremely close distance, the white light is easily recognized, and therefore the LED light emitting device can be preferably used as a light source for irradiating a close place.

Also, according to the LED light emitting device according to the present invention, the plurality of same types of LED elements are used, so that a variation or difference in deterioration rate among the respective LED elements is essentially small, and therefore a color temperature can be easily kept constant both on a production basis and with time. Also, the light having the intermediate color other than the single color light is emitted outside the device, and therefore even if, due to a lot-based variation or difference in deterioration rate occurring among the LED elements, an amount of light having any of the colors is changed, an effect of the change is reduced, and the color temperature of the resultant white light is unlikely to be changed. Also, even if the light amounts of the respective light emitting parts are changed, the color temperature of the white light is not largely changed, and therefore fine color temperature control can be easily performed.

Further, in the case of using two types of white LED devices having different color temperatures to synthesize white light, fine adjustment of a color temperature can be made; however, in the case of attempting to achieve a color temperature of white light emitted by one of the white LED devices, the other white LED device should be extinguished, and toward any of both ends of a color temperature that can be reproduced by the two types of white LED devices, lightness becomes lower. On the other hand, according to the LED light emitting device according to the present invention, a color temperature can be controlled with keeping a balance among outputs of the respective LED elements, so that with ensuring predetermined lightness or higher, the fine adjustment of the color temperature of the white light can be made near a black body locus, and even in the case of achieving a color temperature at any of both ends of the black body locus, the lightness is never lowered.

Also, in the present invention, the plurality of light emitting parts are not completely partitioned, so that it is not necessary to form high partitions within the base material, and therefore manufacturing can be achieved at lower cost by a money amount corresponding to the partitions.

Further, according to the LED light emitting device according to the present invention, the LED elements of the plurality of types of light emitting parts are all the same, and therefore voltage drops are constant, so that, in the case of arranging them in parallel, it is easy to, for example, use variable resistors to adjust values of currents applied to the corresponding LED elements, and adjust a balance among light amounts emitted by the respective LED elements, and thereby the color temperature of the white light emitted by the LED light emitting device can be easily controlled.

Also, there is known an LED light emitting device configured such that a single LED element is sealed by resin dispersed with a plurality of types of phosphors having different emission colors (typically, red phosphors, green phosphors, and blue phosphors); however, in the LED light emitting device, a color temperature value of white light is determined by mixing amounts of the respective types of phosphors, so that the color temperature value is fixed to a constant temperature value but cannot reversibly adjusted.

As the LED light emitting device according to the present invention, from the perspective of easily controlling the color temperature of the white light emitted by the LED light emitting device, one provided with at least a red color based light emitting part that dominantly emits red light and a blue color based light emitting part that dominantly emits blue light is preferable, and one further provided with a green color based light emitting part that dominantly emits green light is more preferable. Note that dominantly emitting some colored light means that a maximum peak in a spectrum of the emitted light is only required to be at least positioned in a wavelength region corresponding to the colored light, and may be emitting only the colored light.

In the LED light emitting device according to the present invention, if partitions are respectively present between the plurality of types of light emitting parts, the respective colored light are unlikely to be mixed. For this reason, the partitions between the respective light emitting parts are configured to be low ones or not provided, and thereby two or more light emitting parts are adapted to overlap with each other in their parts. However, in the LED light emitting device according to the present invention, the ultraviolet radiation emitted from any of the LED elements is once absorbed by the phosphors, so that ensuring lightness is an important subject, and depending on a stacking order of the respective light emitting parts, a loss of a light amount (lightness) in the overlapping portion becomes larger. For this reason, in the part where the two or more light emitting parts overlap with each other, the red color based light emitting part is preferably positioned below the blue color based light emitting part. The blue light is absorbed by the green phosphor and red phosphor to excite them, but the red light is not absorbed by the green phosphor or blue phosphor. On the other hand, the green light is absorbed by the red phosphor to excite it, but not absorbed by the blue phosphor. For this reason, in the case of providing the green color based light emitting part, in the portion where it overlaps with the other light emitting parts, the green color based light emitting part is preferably provided to be positioned above the red color based light emitting part and below the blue color based light emitting part.

In order to control the color temperature of the white light emitted by the LED light emitting device according to the present invention, it is preferable to use, for example, a light emitting system provided with: the LED light emitting device according to the present invention; output adjustment parts that are respectively connected to the LED elements of the plurality of types of light emitting parts of the LED light emitting device; a single color temperature reception part that receives color temperature data having a predetermined color temperature value; and an output control part that acquires the color temperature data, and outputs a control signal generated on the basis of the color temperature data to the respective output adjustment parts that are respectively connected to the LED elements of the plurality of types of light emitting parts. Such a light emitting system is also included in the present invention.

A method for manufacturing the LED light emitting device according to the present invention is not particularly limited; however, the LED light emitting device can be manufactured with use of, for example, the following method. That is, a method provided with: a step of mounting a plurality of same LED elements on a bottom surface of a concave portion of a base material having the concave portion that is opened at an upper end surface; a red color based light emitting part forming step of, in a state where the base material mounted with the LED elements is tilted, injecting, in the concave portion of the base material, a resin composition containing a red phosphor to thereby form a red color based light emitting part that seals one of the LED elements with use of the resin composition to dominantly emit red light; and a blue color based light emitting part forming step of, in a state where the base material formed with the red color based light emitting part is tilted, injecting, in the concave portion of the base material, a resin composition containing a blue phosphor so as to overlap with a part of the red color based light emitting part to thereby form a blue color based light emitting part that seals one of the LED elements with use of the resin composition to dominantly emit blue light is cited. Such an LED light emitting device manufacturing method is also included in the present invention.

The method for manufacturing the LED light emitting device according to the present invention may be further provided with, between the red color based light emitting part forming step and the blue color based light emitting part forming step, a green color based light emitting part forming step of, in the state where the base material formed with the red color based light emitting part is tilted, injecting, in the concave portion of the base material, a resin composition containing a green phosphor so as to overlap a portion of the red color based light emitting part to thereby form a green color based light emitting part that seals one of the LED elements with use of the resin composition to dominantly emit green light.

Advantageous Effects of Invention

According to the present invention having such configurations, even as viewed from an extremely close distance, recognition as white light is easily gained; also fine control of a color temperature is easily performed; and further, with ensuring predetermined lightness or higher, a fine adjustment of the color temperature of the white light can be made near the black body locus.

DESCRIPTION OF EMBODIMENTS

Figure 1:
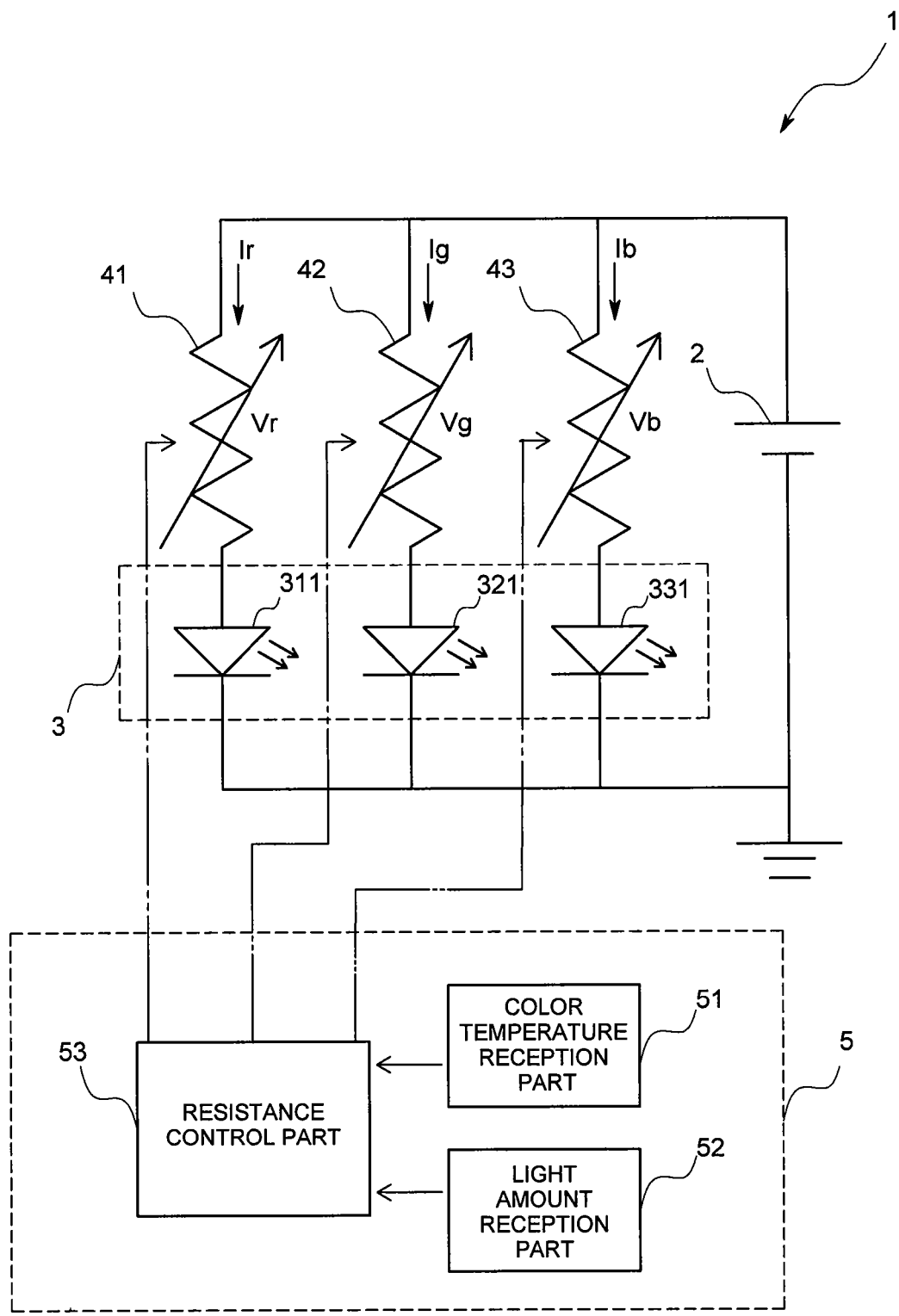
FIG. 1 is a schematic configuration diagram of a light emitting system according to a first embodiment of the present invention.

Embodiments of the present invention will hereinafter be described referring to the drawings.

First Embodiment

Figure 2:
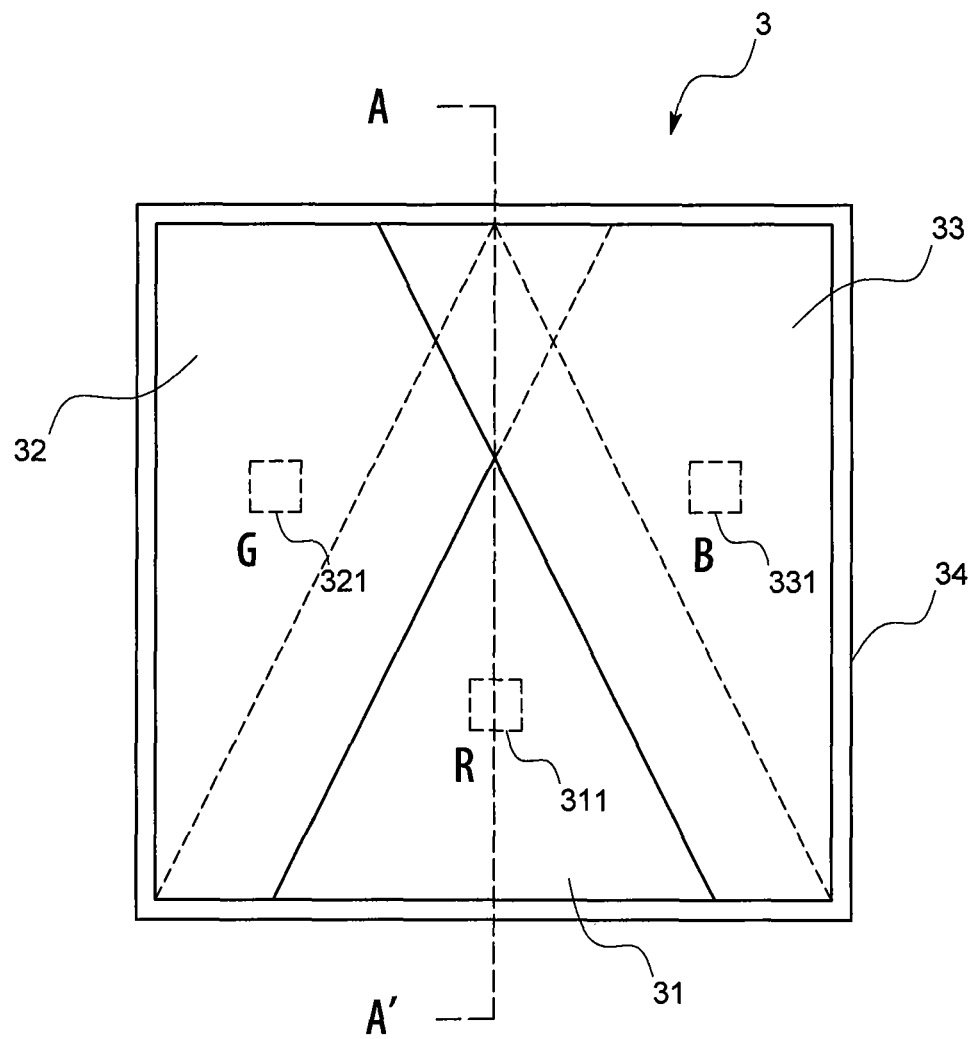
FIG. 2 is a plan view of an LED light emitting device in the same embodiment.

A light emitting system 1 according to the present embodiment is, as illustrated in FIGS. 1 and 2, provided with: a power source 2; an LED light emitting device 3 having three types of light emitting parts 31, 32, and 33 that are provided with LED elements 311, 321, 331 to emit red light, green light, and blue light, respectively; variable resistors 41, 42, and 42 that are connected to the LED elements 311, 321, and 331 of the light emitting parts 31, 32, and 33, respectively; and a control device 5.

In the following, the respective parts are described in detail.

The power source 2 supplies a voltage larger than voltage drops of the LED elements 311, 321, and 331.

The LED light emitting device 3 is provided with the red color based light emitting part 31 that emits the red light, green color based light emitting part 32 that emits the green light, and blue color based light emitting part 33 that emits the blue light, and each of the light emitting parts 31, 32, and 33 includes: the LED element 311, 321, or 331 that emits near-ultraviolet radiation; and resin that is provided to seal the LED element 311, 321, or 331 and dispersed with phosphors that absorb the near-ultraviolet radiation to emit the red light, green light, or blue light.

Figure 3:
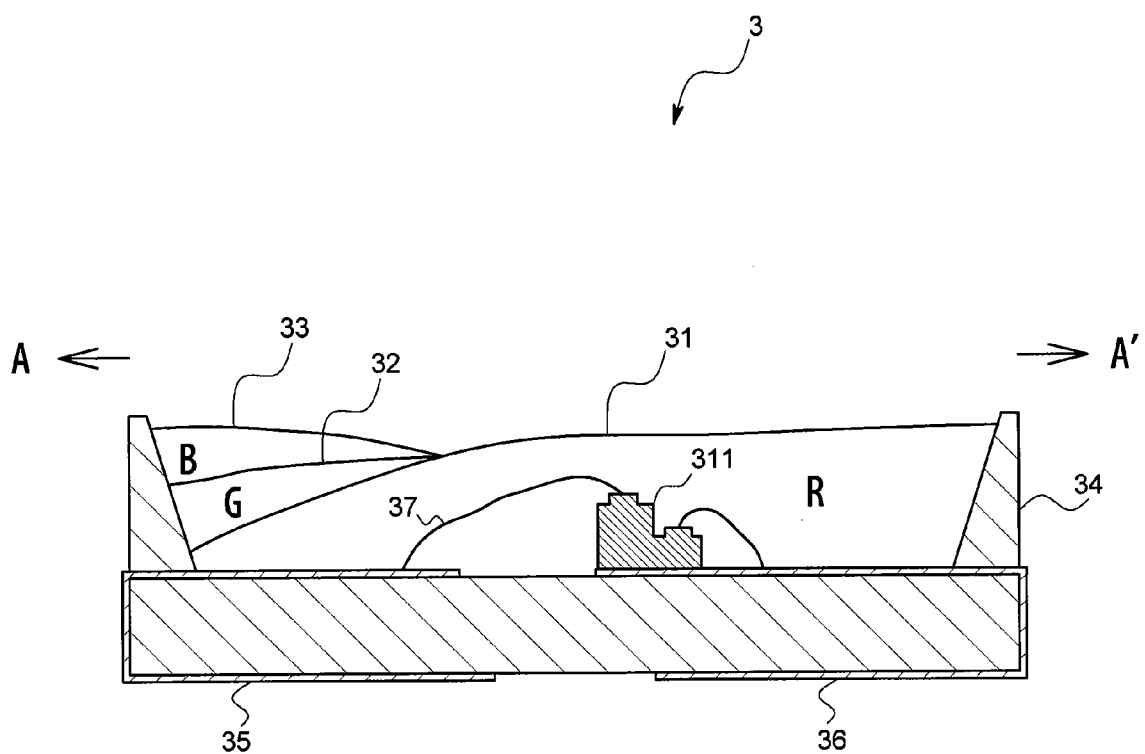
FIG. 3 is an AA' line end view of the LED light emitting element in the same embodiment.

More specifically, the LED light emitting device 3 is, as illustrated in FIGS. 2 and 3, configured such that, on an opening portion bottom surface of a base material 34 that is made of ceramics such as alumina or resin such as polyamide and has a tapered opening portion enlarging outward, of which an inner surface functions as a reflector (reflective plate), the LED elements 311, 321, 331 are surface-mounted (flip-chip mounted); the resin such as heat-curable silicone-based resin dispersed with the phosphors of respective types is filled in the opening portion so as to seal the respective LED elements 311, 321, and 331; and thereby the respective light emitting parts 31, 32, and 33 are formed. Note that the LED light emitting device 3 is not necessarily quadrangular-shaped in a plan view as illustrated in FIG. 2, but may be circular-shaped in a plan view as illustrated in FIG. 4.

Figure 4:
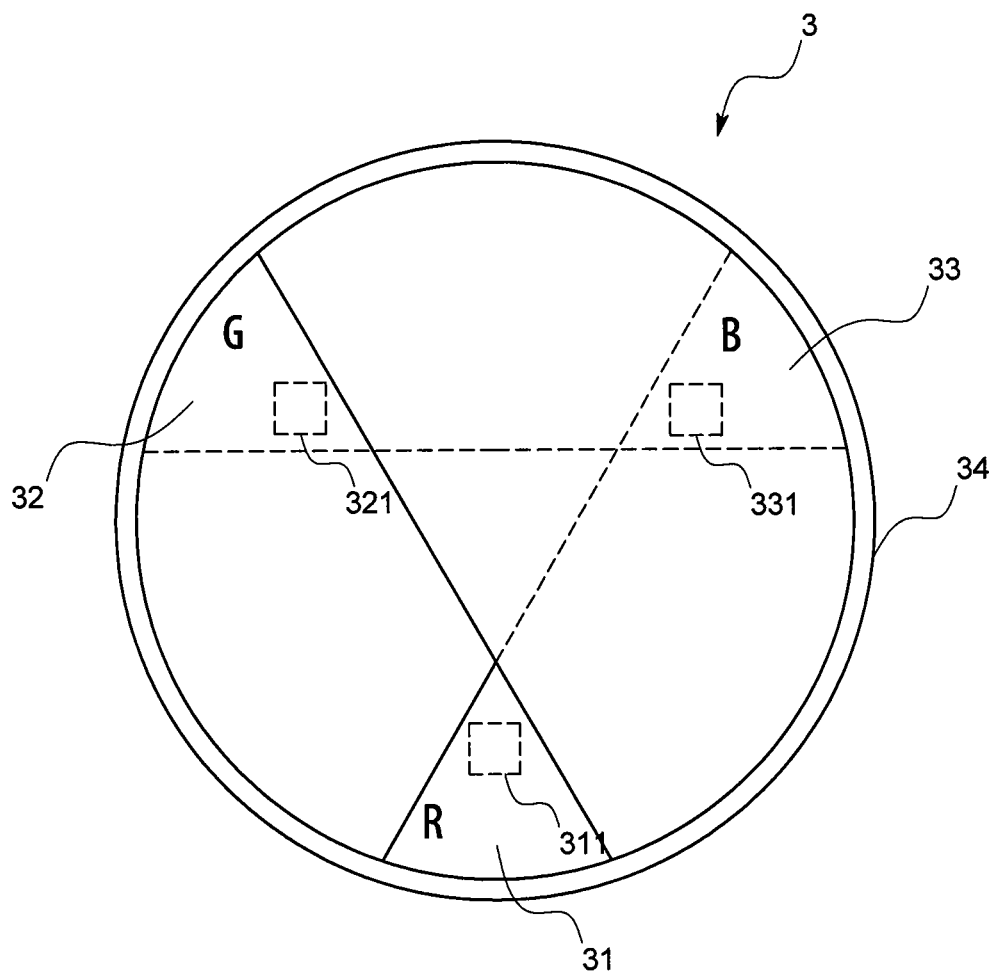
FIG. 4 is a plan view of an LED light emitting device in another embodiment.
Figure 5:
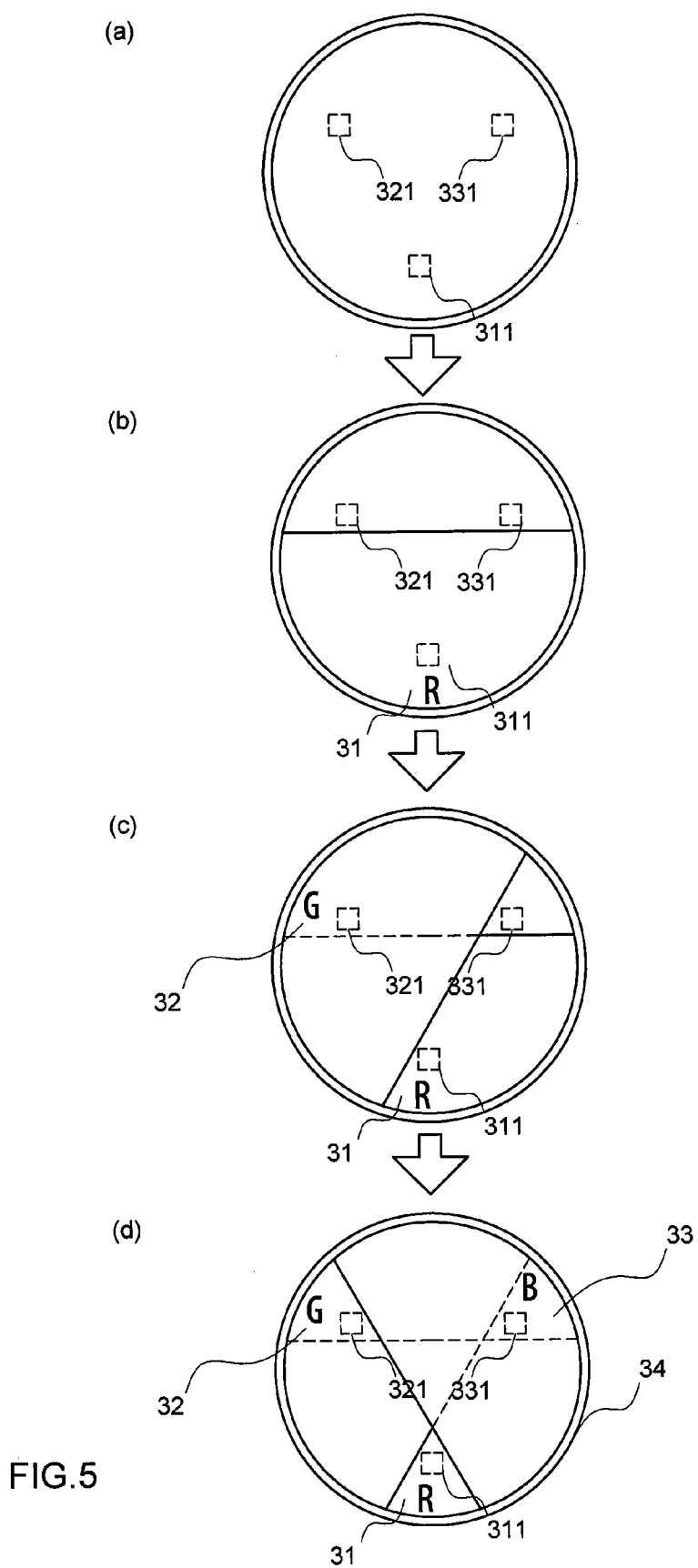
FIG. 5 is a diagram illustrating a manufacturing method for the LED light emitting device in the same embodiment.

Next, a method for manufacturing the LED light emitting device 3 of an embodiment illustrated in FIG. 4 is described. To manufacture the LED light emitting device 3, as illustrated in FIG. 5, first, on the opening portion bottom surface of the base material 34, the same three LED elements are mounted (FIG. 5(a)).

Figure 6:
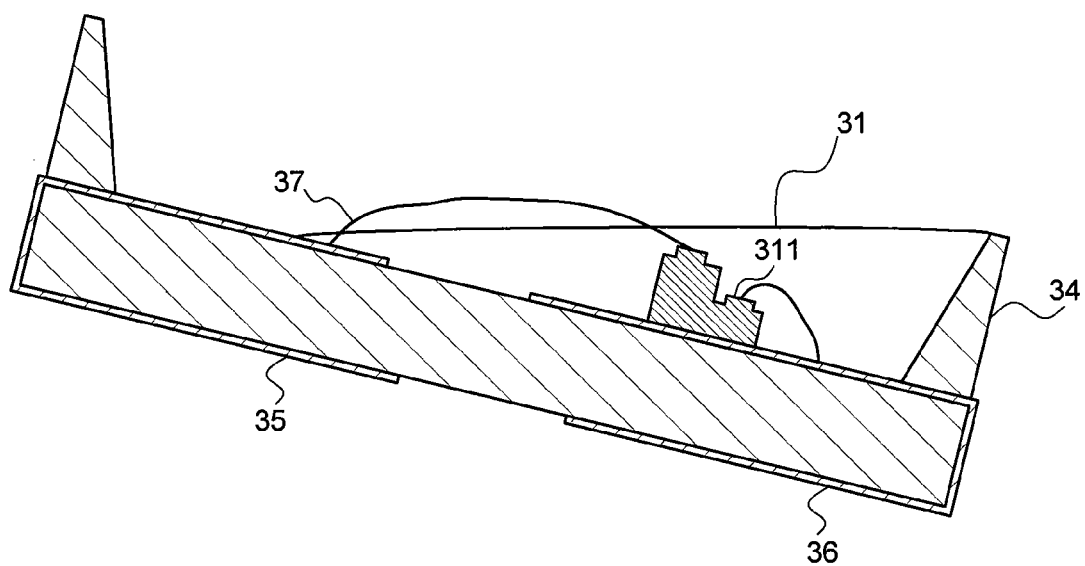
FIG. 6 is a diagram illustrating the manufacturing method for the LED light emitting device in the same embodiment.

In the present embodiment, between the respective light emitting parts 31, 32, and 33, low partitions (not illustrated) are provided, and first, as illustrated in FIG. 6, in a state where the base material 34 is tilted, the resin dispersed with the red phosphors is filled in the opening portion of the base material 34 to form the red color based light emitting part 31 (FIG. 5(b)); then, in the same manner, in the state where the base material 34 is tilted, the resin dispersed with the green phosphors is filed to form the green color based light emitting part 32 (FIG. 5(c)); and finally, the resin dispersed with the blue phosphors is filled to form the blue color based light emitting part 33 (FIG. 5(d)). For this reason, as illustrated in FIGS. 2 and 4, each of the light emitting parts 31, 32, and 33 partially overlaps with the other light emitting parts, and in the overlapping portion, the red color based light emitting part 31 is positioned below the other light emitting parts, and the blue color based light emitting part 33 is positioned above the other light emitting parts. By stacking the respective light emitting parts 31, 32, and 33 in this order, a light amount loss in the overlapping portion can be reduced. Note that the partitions between the respective light emitting parts 31, 32, and 33 are preferably translucent ones. Also the partitions between the respective light emitting parts 31, 32 and 33 are not necessarily required.

The base material 34 is provided with an anode 35 and a cathode 35, which are connected to the LED elements 311, 321, and 331 through bonding wires 37.

The LED elements 311, 321, and 331 of the respective light emitting parts 31, 32, and 33 are all the same ones, each having, for example, a square shape of 350 μm×350 μm in a plan view, an MQW structure in which six pairs of $In_{0.03}Ga_{0.97}$ well layer and GaN barrier layer are stacked, and an emission peak wavelength of 380 nm.

As the red light phosphors used in the red color based light emitting part 31, for example, ones including $Ln_2O_2S$:Eu (Ln=Y, La, Gd, Lu, Sc) as a main component are cited; as the green light phosphors used in the green color based light emitting part 32, for example, ones including $YsSiO_5$:Ce,Tb, and $(Y,Gd)3Al_5O_{12}$:Ce,Tb as main components are cited; and as the blue light phosphors used in the blue color based light emitting part 33, for example, ones including $BaNgAl_{10}O_{17}$: Eu,Mn as a main component are cited.

Each of the variable resistors 41, 42, and 43 has three terminals, and is one configured such that a resistance between both end terminals is constant, and by rotating a shaft, resistance values between a central terminal and the both end terminals are varied, on the basis of which amounts of currents Ir, Ig, and Ib flowing through the LED elements 311, 321, and 331 are reversibly adjusted.

The control device 5 is configured to include a CPU, a memory, and a digital or analog electric circuit having an AM converter, a D/A converter, and the like, and may be a dedicated one or one configured such that a general-purpose computer such as a personal computer is used for part or all. Alternatively, without using the CPU, the control device 5 may be configured to fulfill functions as respective parts only with the analog circuit, or is not necessarily a physically integrated one but may be one including a plurality of devices that are mutually connected by wired or wireless connections. Also, the control device 5 is configured to, by storing a predetermined program in the memory and cooperatively operating the CPU and its peripheral devices according to the program, fulfill the functions as a color temperature reception part 51, a light amount reception part 52, and a resistance control part 53.

The color temperature reception part 51 is one that is provided with, for example, a dial, and receives color temperature data having a color temperature value selected between 1800 and 16000 K by rotating the dial.

The light amount reception part 52 is one that is provided with, for example, a dial, and receives light amount data having a light amount value (lightness) selected by rotating the dial.

The resistance control part 53 is one that acquires the color temperature data from the color temperature reception part 51 and the light amount data from the light amount reception part 52; on the basis of the color temperature data and light amount data, generates a control signal; and outputs the control signal to each of the variable resistors 41, 42, and 42 to adjust a resistance value.

Figure 7:
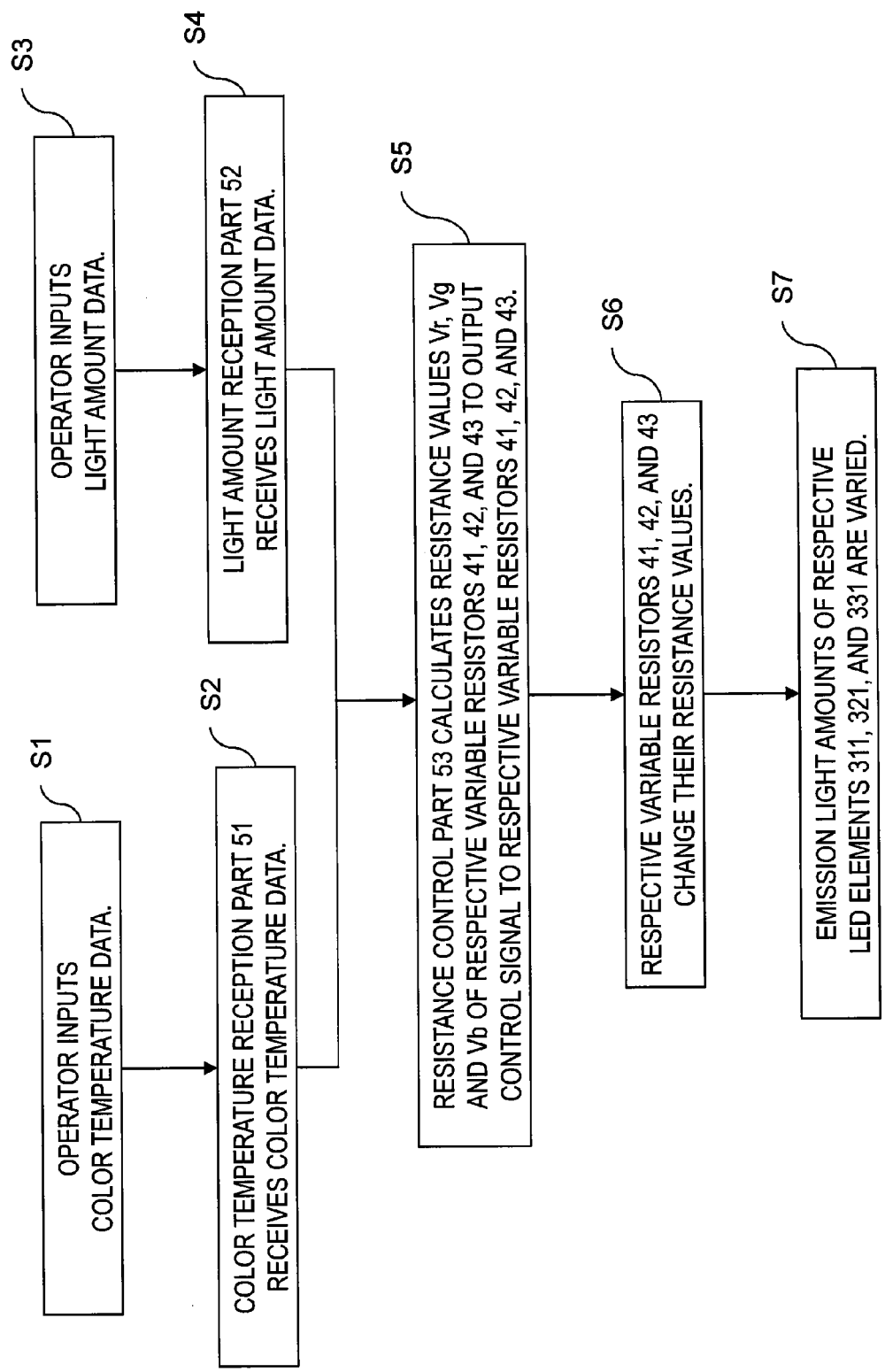
FIG. 7 is a flowchart illustrating a method for adjusting a color temperature and light amount of white light emitted by the LED light emitting device in the same embodiment.

Next, a method for using the light emitting system 1 to adjust a color temperature and a light amount of white light emitted by the LED light emitting device 3 is described referring to a flowchart of FIG. 7.

First, an operator turns the dial to thereby input color temperature data having a predetermined color temperature value (Step S1), and the color temperature data is received by the color temperature reception part 51 (Step S2).

Similarly, the operator turns the dial to input light amount data having a predetermined light amount value (Step S3), and the light amount data is received by the light amount reception part 52 (Step S4).

The resistance control part 53 acquires the color temperature data and light amount data from the color temperature reception part 51 and the light amount reception part 52, respectively. On the other hand, a current ratio among the respective LED elements for achieving a desired color temperature is preliminarily stored in the memory as a table, and on the basis of the color temperature value indicated by the color temperature data, the resistance control part refers to the table to obtain the current ratio among the respective LED elements; also on the basis of the light amount value indicated by the light amount data, calculates a ratio (Ir:Ig:Ib) among values of currents flowing through the respective LED elements 311, 321, and 331 and a total flow amount (Ir+Ig+Ib) of the currents flowing through the respective LED elements 311, 321, and 331; further, from this, calculates resistance values Vr, Vg, and Vb of the respective variable resistors 41, 42, and 43; and generates a control signal having the resistance values to output it to the respective variable resistors 41, 42, and 43 (Step S5).

The calculation process performed by the resistance control part 53 is extremely simple because the voltage drops of the respective LED elements 311, 321, and 331 are the same, and therefore a calculation circuit of the resistance control part 53 is only required to have an extremely simple configuration.

The respective variable resistors 41, 42, and 43 receive the control signal to change their resistance values according to the control signal (Step S6).

After the resistance values of the respective variable resistors 41, 42, and 43 have been changed, the values of the currents flowing through the respective LED elements 311, 321, and 331 are varied, and amount values of light emitted by the respective LED elements 311, 321, and 331 are also varied (Step S7).

As a result, the color temperature and light amount of the white light emitted by the LED light emitting device 3 is controlled.

If so, the three light emitting parts overlap with one another in their parts within the single LED light emitting device 3, and therefore, from the overlapping portion, light having intermediate color other than the respective single color light of red light, green light, and blue light is emitted, so that even as viewed from an extremely close distance, the white light is easily recognized, and the LED light emitting device 3 can be preferably used as a light source for irradiating a close place.

Also, according to the LED light emitting device 3 according to the present embodiment, the light having the intermediate color other than the single color light is emitted outside the device, and therefore even if, due to a lot-based variation or difference in deterioration rate among the LED elements 311, 321, and 331, an amount of light having any of the colors is changed, an effect of the change is reduced, and the color temperature of the resultant white light is unlikely to be changed. Also, even if the light amounts of the respective light emitting parts 31, 32, and 33 are changed, the color temperature of the white light is not largely changed, and therefore fine color temperature control can be easily performed.

Further, in the case of using two types of white LED devices having different color temperatures to synthesize white light, a fine adjustment of a color temperature can be made; however, in the case of attempting to achieve a color temperature of white light emitted by one of the white LED devices, the other white LED device should be extinguished, and toward any of both ends of a color temperature that can be reproduced by the two types of white LED devices, lightness becomes lower. On the other hand, according to the LED light emitting device according to the present invention, a color temperature can be controlled with keeping a balance among outputs of the respective LED elements 311, 321, and 331, so that with ensuring predetermined lightness or higher, the fine adjustment of the color temperature of the white light can be made near a black body locus, and even in the case of achieving a color temperature at any of both ends of the black body locus, the lightness is never lowered.

Further, according to the LED light emitting device according to the present embodiment, the LED elements 311, 321, and 331 included in the LED light emitting device 3 are all the same, and therefore the voltage drops are constant, so that it is easy to use the variable resistors 41, 42, and 43 to adjust the values of the currents applied to the corresponding LED elements 311, 321, and 331, and adjust the balance among the light amounts emitted by the respective LED elements 311, 321, and 331, and thereby the color temperature and light amount (lightness) of the white light emitted by the LED light emitting device 3 can be easily controlled.

Second Embodiment

Figure 8:
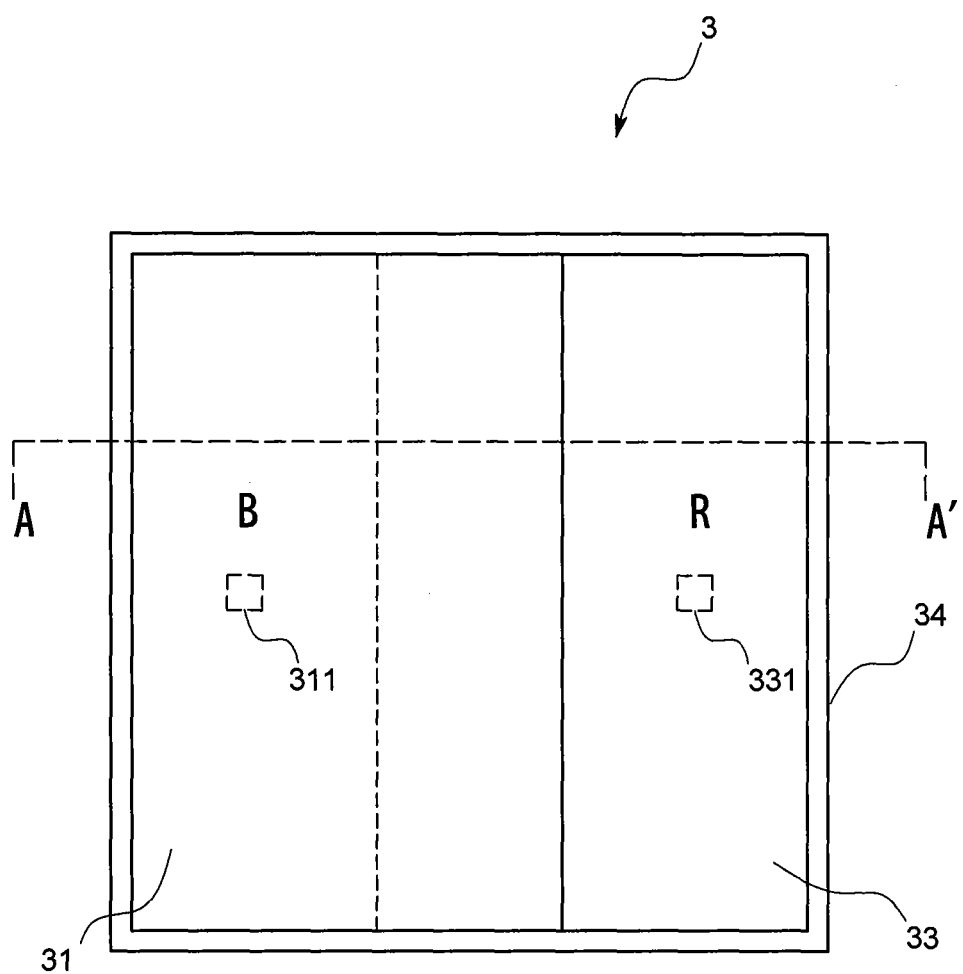
FIG. 8 is a plan view of an LED light emitting device in a second embodiment.

In the following, a second embodiment is described referring to FIGS. 8 and 9; however, in the following description, the description is provided with focusing on different points from the first embodiment.

Figure 9:
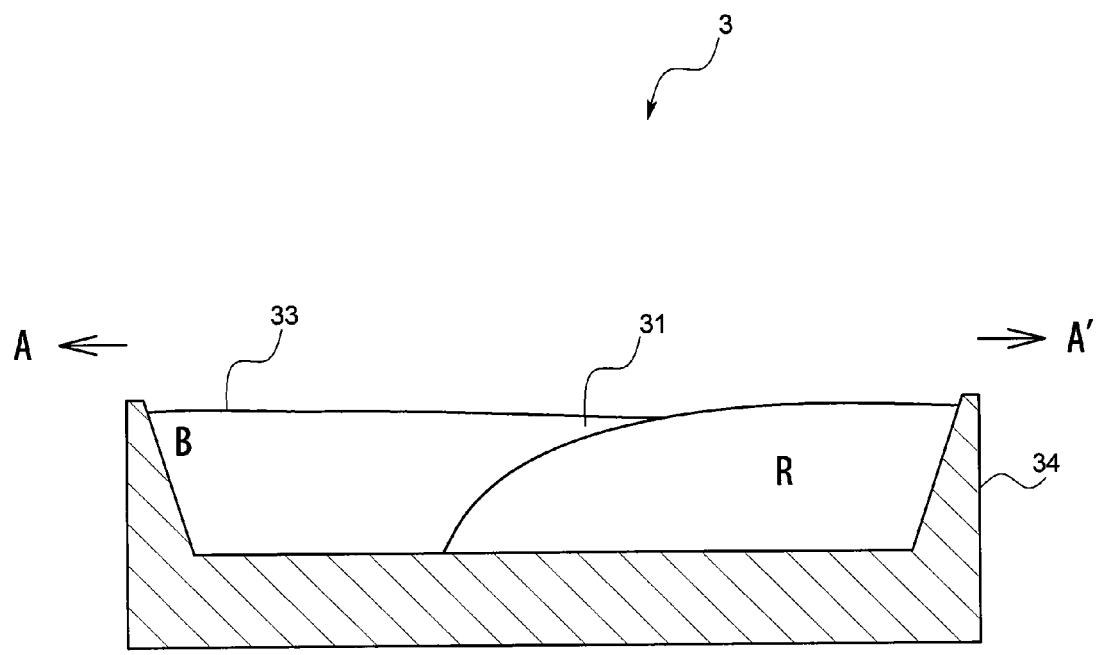
FIG. 9 is an AA' line end view of the LED light emitting element in the second embodiment.

An LED light emitting device 3 in the second embodiment is provided with: a red color based light emitting part 31 that contains red phosphors, green phosphors, and blue phosphors at a weight ratio of 70/15/15 and dominantly emits red light; and a blue color based light emitting part 33 that contains red phosphors, green phosphors, and blue phosphors at a weight ratio of 30/25/45 and dominantly emits blue light, and as illustrated in FIG. 9, the red color based light emitting part 31 and the blue color based light emitting part 33 overlap with each other in their parts. Also, in an overlapping portion, the red color based light emitting part 31 is positioned below the blue color based light emitting part 33.

According to the present embodiment, in the part where the red color based light emitting part 31 and the blue color based light emitting part 33 overlap with each other, the light emitted by the respective light emitting parts 31 and 33 are easily mixed, and therefore natural white light having more intermediate shade can be easily obtained.

Third Embodiment

Figure 10:
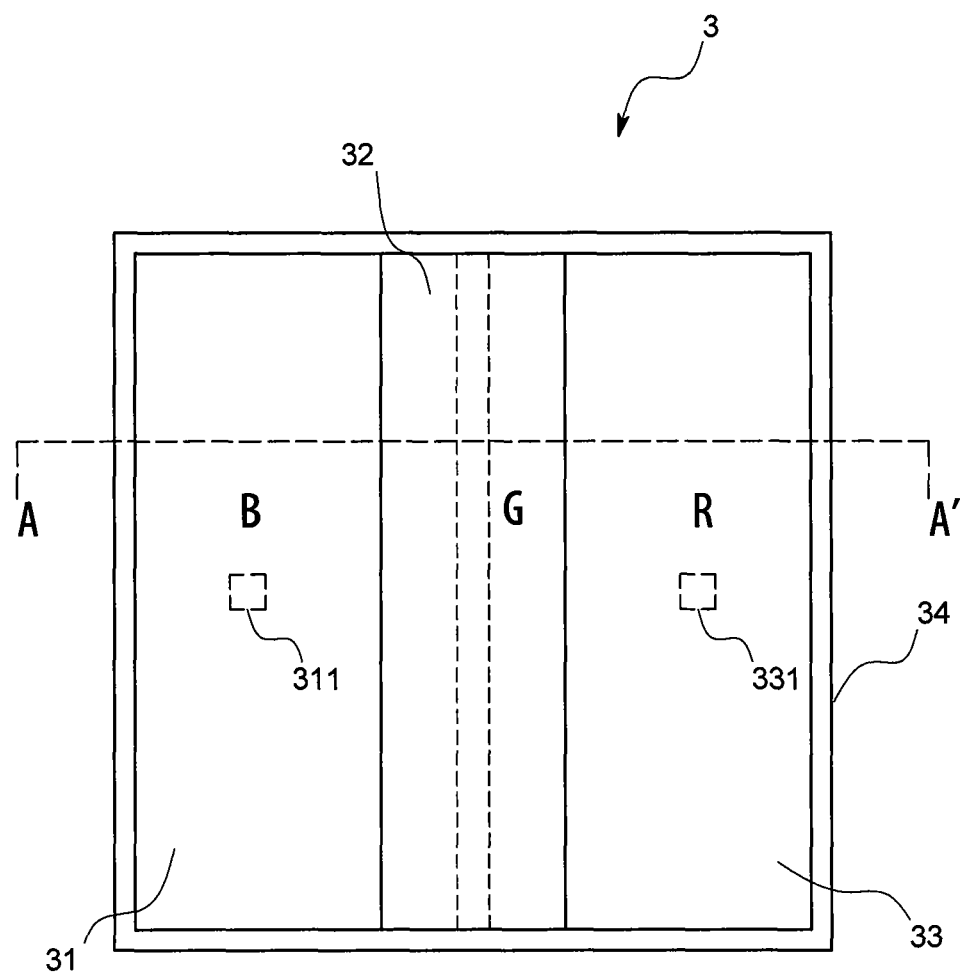
FIG. 10 is a plan view of an LED light emitting device in a third embodiment.

In the following, a third embodiment is described referring to FIGS. 10 and 11; however, in the following description, the description is provided with focusing on different points from the first embodiment.

Figure 11:
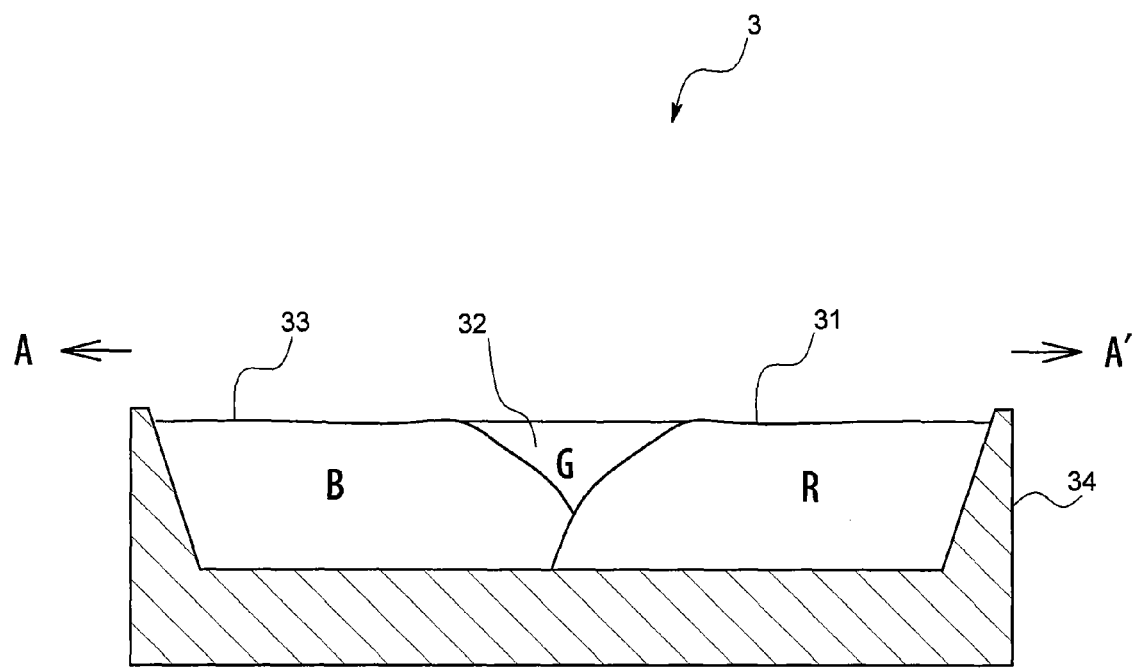
FIG. 11 is an AA' line end view of the LED light emitting element in the third embodiment.

An LED light emitting device 3 in the third embodiment is provided with: a red color based light emitting part 31 that contains red phosphors, green phosphors, and blue phosphors at a weight ratio of 70/15/15 and dominantly emits red light; a green color based light emitting part 32 that contains red phosphors, green phosphors, and blue phosphors at a weight ratio of 30/40/30 and dominantly emits green light; and a blue color based light emitting part 33 that contains red phosphors, green phosphors, and blue phosphors at a weight ratio of 30/25/45 and dominantly emits blue light, and as illustrated in FIG. 11, the red color based light emitting part 31, green color based light emitting part 32, and blue color based light emitting part 33 overlap with one another in their parts. Also, in the overlapping portion, the red color based light emitting part 31 is positioned in a lowermost location, and the green color based light emitting part 32 is positioned in an uppermost location.

In the present embodiment, in the green color based light emitting part 32, an LED element is not sealed, and the green color based light emitting part 32 shares LED elements 311 and 331 with the red color based light emitting part 31 and the blue color based light emitting part 33, respectively. Also, the phosphors contained in the green color based light emitting part 32 are excited by light emitted by the LED element 311 sealed in the red color based light emitting part 31 or the LED element 331 sealed in the blue color based light emitting part 33.

According to the present embodiment as described above, the green color based light emitting part 32 is positioned in the uppermost location, so that white light in which the red color based light emitted by the red color based light emitting part 31 and the blue color based light emitted by the blue color based light emitting element 33 are mixed is further mixed with the green color based light, and therefore white light having natural shade closer to a black body locus can be emitted. Also, in the green color based light emitting part 32, an LED element is not sealed, and the green color based light emitting part 32 shares the LED elements 311 and 331 with the red color based light emitting part 31 and the blue color based light emitting part 33, respectively, so that it is not necessary to independently drive three LED elements, and therefore control becomes easy.

In the third embodiment, each of the red color based light emitting part 31, the green color based light emitting element 32, and the blue color based light emitting element 33 contains the three types of phosphors; however, as in the first embodiment, the red color based light emitting part 31 may contain only red phosphors; the green color based light emitting part 32 may contain only green phosphors; and the blue color based light emitting part 33 may contain only blue phosphors.

Note that the present invention is not limited to any of the above embodiments.

For example, a dimming control method is not particularly limited, but may be, for example, (1) constant current dimming control by a variable current source, (2) constant voltage dimming control by a variable voltage source and limiting resistor, (3) pulse width dimming control or PWM dimming control using a constant or variable voltage source and a limiting resistor, (4) pulse width dimming control or PWM dimming control using a constant or variable current source and a limiting resistor, or other dimming control.

Figure 12:
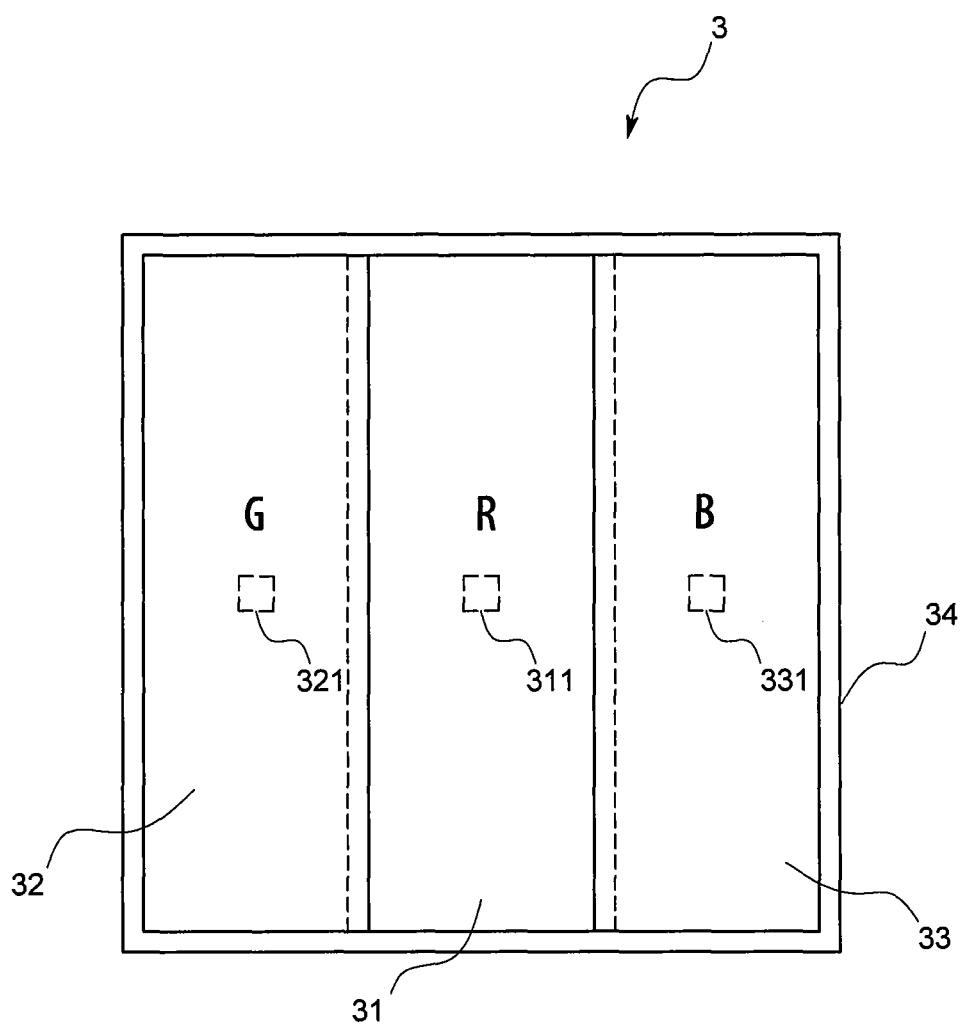
FIG. 12 is a plan view of an LED light emitting device in still another embodiment.
Figure 13:
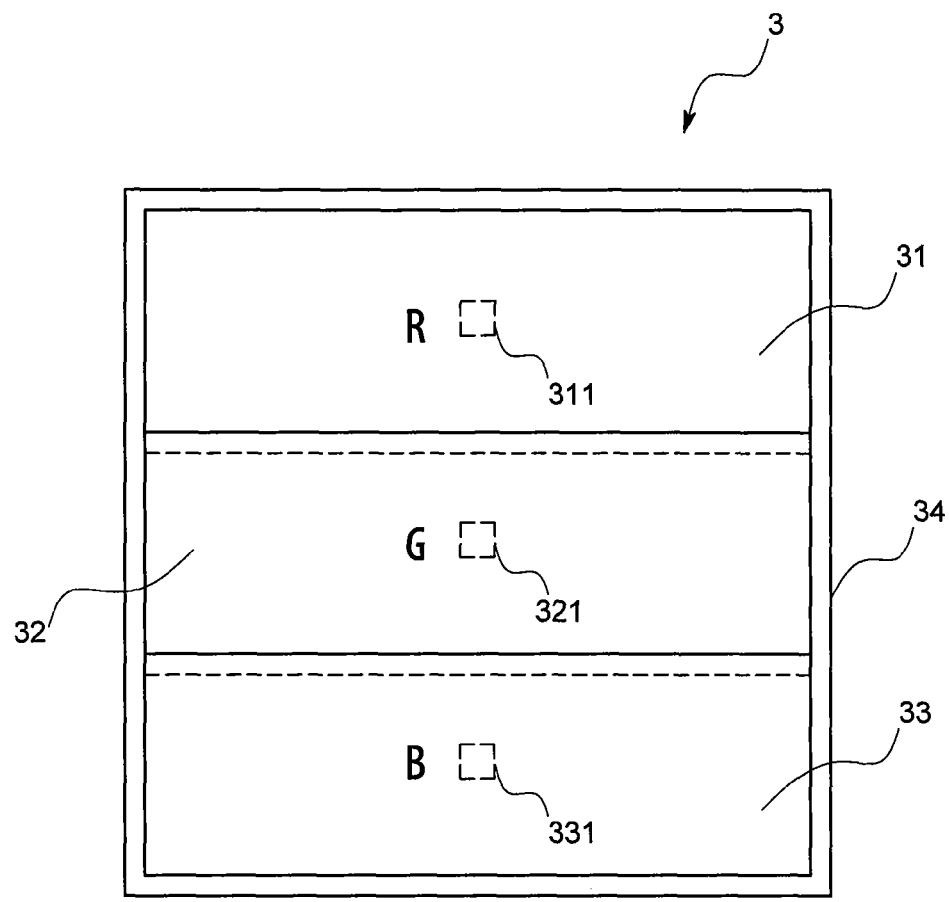
FIG. 13 is a plan view of an LED light emitting device in yet another embodiment.

Also, locations of the respective light emitting parts 31, 32, and 33 in the LED light emitting device 3 may be those as illustrated in FIG. 12 or 13.

Further, the color temperature reception part 51 and the light amount reception part 52 may be ones that respectively receive color temperature data and light amount data inputted through input means other than the dials, such as a keyboard.

Also, on a surface of each of the light emitting parts 31, 32, and 33 of the LED light emitting device 3, a moistureproof layer formed by coating a moistureproof filter or moistureproof paint made of glass or resin may be provided. This enables phosphors, which absorbed moisture, to be prevented from being thermally deteriorated, and a change in color temperature to be suppressed even after lighting for a long time.

Further, ultraviolet radiation is detrimental to humans, and also results in color fading of an irradiated object, and therefor in order to prevent leakage of ultraviolet radiation that is not absorbed by phosphors, on the surface of each of the light emitting parts 31, 32, and 33, a filter that cuts off light having a wavelength of 410 nm or lower may be provided.

Also, the LED elements 311, 321, and 331 and respective types of phosphors are not particularly limited in terms of chemical configuration, but may be ones having chemical compositions other than those used in any of the above embodiments.

Besides, the present invention is not limited to any of the above embodiments, but may be configured by appropriately combining parts or all of the above-described various configurations without departing from the scope of the present invention.

INDUSTRIAL APPLICABILITY

As described, according to the present invention, the voltage drops in the LED elements of the respective light emitting parts are constant, so that it is easy to adjust the values of the currents applied to the respective LED elements to adjust the balance among the light amounts, and for this reason, the color temperature and light amount (lightness) of the white light emitted by the LED light emitting device can be easily controlled. Accordingly, for example, the present invention can be used as a light source for plant growth to, in concert with a biological rhythm or the like of a plant, irradiate white light having a color temperature value corresponding to the rising sun, setting sun, or the like.

EXPLANATIONS OF LETTERS OR NUMERALS

1: Light emitting system
3: LED light emitting device
31, 32, 33: Light emitting part
311, 321, 331: LED element
41, 42, 43: Variable resistor
51: Color temperature reception part
53: Resistance control part

The invention claimed is:

1. A light emitting device (an LED) comprising a plurality of types of light emitting parts, each having:
an LED element that emits ultraviolet radiation or violet color visible light; and a phosphor that absorbs the ultraviolet radiation or the violet color visible light to emit colored light, wherein:
lights emitted by the plurality of types of light emitting parts become white light when all mixed with each other;
the LED elements of the plurality of types of light emitting parts are all of same one type and mounted on a single base material; and
two or more light emitting parts overlap with each other in their parts,
wherein the LED elements are each arranged to be positioned below a non-overlapping portion of the light emitting part and
the plurality of types of light emitting parts comprise at least a red color based light emitting part that dominantly emits red light and a blue color based light emitting part that dominantly emits blue light,
wherein in the overlapping portion, the red color based light emitting part is positioned below the blue color based light emitting part, and
wherein overlapping two upper light emitting parts are thicker than an overlapped underlying light emitting part.

2. The light emitting device according to claim 1, further comprising:
a green color based light emitting part that dominantly emits green light, wherein
in the overlapping portion, the green color based light emitting part is positioned above the red color based light emitting part and below the blue color based light emitting part.

3. The light emitting device according to claim 1 wherein the single base material has a tapered opening portion enlarging outwardly.

4. The light emitting device according to claim 1 wherein the two types of light emitting parts includes
a red color based light emitting part that contains red phosphors, green phosphors, and blue phosphors having a weight ratio of about 70/15/15 to emit predominately red light, and
a blue color based light emitting part that contains red phosphors, green phosphors, and blue phosphors having a weight ratio of about 30/25/45 to emit predominately blue light.

5. The light emitting device according to claim 1 wherein three types of light emitting parts includes
a red color based light emitting part that contains red phosphors, green phosphors and blue phosphors having a weight ratio of about 70/15/15 to emit predominately red light,
a green color based light emitting part that contains red phosphors, green phosphors, and blue phosphors having a weight ratio of about 30/40/30 to emit predominately green light, and
a blue color based light emitting part that contains red phosphors, green phosphors and blue phosphors having a weight ratio of about 30/25/45 to emit predominately blue light, wherein
the red light, green light and blue light will mix in the light emitting device to provide a white light with a natural shade closer to a black body locus.

6. The light emitting device according to claim 1, comprising:
translucent partitions are arranged between the respective light emitting parts.

7. The light emitting device according to claim 1, wherein a partition is arranged between the respective light emitting parts.

8. The light emitting device according to claim 1, wherein the single base material has a surface for supporting two or more LED elements that are spaced from each other on the surface, each LED element has a different color light emitting phosphor layer positioned vertically above the respective LED element and extending from the respective LED element to a peripheral edge of the single base material with a progressively less thickness.

9. The light emitting device according to claim 8 wherein the peripheral edge of the single base material is a part of an overlap of the two or more light emitting parts.

10. The light emitting device according to claim 9 wherein the peripheral edge of the single base material includes an overlap of three light emitting parts.

11. A light emitting device for providing white light, comprising:
a base member;
a plurality of light emitting elements mounted on the base member, each of the plurality of light emitting elements has the same electrical characteristics and provides the same ultraviolet radiation or violet color visible light when activated;
a first phosphor containing material for absorbing the radiation from a first light emitting element of the plurality of light emitting elements, is provided as a first light emitting layer overlapping the first light emitting element to emit a first color light;
a second phosphor containing material for absorbing the radiation from a second light emitting element of the plurality of light emitting elements, is provided as a second light emitting layer overlapping the second light emitting element to emit a second color light; and a third phosphor containing material for absorbing the radiation from a third light emitting element of the plurality of light emitting elements, is provided as a third light emitting layer overlapping the third light emitting element to emit a third color light, each of the respective first, second and third color light is different in wavelength and when combined can provide white light, wherein two or more light emitting layers with phosphor overlap at a distance from the respective first, second and third light emitting element but do not overlap above the respective first, second and third light emitting elements, and the plurality of types of light emitting layers comprise at least, a red color based light emitting layer that dominantly emits red light and a blue color based light emitting layer that dominantly emits blue light, wherein in the overlapping portion, the red color based light emitting layer is positioned below the blue color based light emitting layer, and wherein two respective upper overlapping light emitting layers are thicker than the underlying light emitting layer disposed on a surface of the base member.

12. The light emitting device according to claim 11 wherein the first light emitting layer contains red phosphors, green phosphors and blue phosphors having a weight ratio of about 70/15/15 to emit predominately red light, the second light emitting layer contains red phosphors, green phosphors and blue phosphors having a weight ratio of about 30/40/30 to emit predominately green light, and the third light emitting layer contains red phosphors, green phosphors and blue phosphors having a weight ratio of about 30/25/45 to emit predominately blue light, wherein the red light, green light and blue light will mix in the light emitting device to provide a white light with a natural shade closer to a black body locus.

13. The light emitting device according to claim 11 further comprising translucent partitions arranged on the base member between the respective first, second and third light emitting elements.

14. The light emitting device according to claim 11 wherein the respective first, second and third light emitting layers extend from their respective light emitting elements to a peripheral edge of the base member with a progressively less thickness.

15. The LED light emitting device according to claim 14, wherein the peripheral edge is a part of an overlap of two or more light emitting layers.

16. A light emitting device (an LED) comprising a plurality of types of light emitting parts, each having:

an LED element that emits ultraviolet radiation or violet color visible light; and a phosphor that absorbs the ultraviolet radiation or the violet color visible light to emit colored light wherein:

lights emitted by the plurality of types of light emitting parts become white light when all mixed with each other;

the LED elements of the plurality of types of light emitting parts have a common light emission property for a predetermined wavelength and are mounted on a single base material; and two or more light emitting parts overlap with each other in their parts; and the LED elements are each arranged to be positioned below a non-overlapping portion of the light emitting part, wherein the single base material has a surface for supporting the LED elements that are spaced from each other on the surface, each LED element has a different color light emitting phosphor layer position vertically above the respective LED element and extending, from the respective LED element to a peripheral edge of the single base material with a progressively less thickness, wherein the peripheral edge is a part of an overlap of the two or more light emitting parts, wherein the peripheral edge includes an overlap of three light emitting parts, and wherein the respective upper overlapping two light emitting parts are thicker than the underlying light emitting part disposed on the surface of the single base material.

17. The light emitting device according to claim 16 wherein a first light emitting part contains red phosphors, green phosphors and blue phosphors having a weight ratio of about 70/15/15 to emit predominately red light, a second light emitting part contains red phosphors, green phosphors and blue phosphors having a weight ratio of about 30/40/30 to emit predominately green light, and a third light emitting part contains red phosphors, green phosphors and blue phosphors having a weight ratio of about 30/25/45 to emit predominately blue light, wherein the red light, green light and blue light will mix in the light emitting device to provide a white light with a natural shade closer to a black body locus.

18. The light emitting device according to claim 16 further comprising translucent partitions arranged on the base member between the respective first, second and third light emitting elements.

* * * * *